US011264781B2

(12) United States Patent
Yamaji et al.

(10) Patent No.: US 11,264,781 B2
(45) Date of Patent: Mar. 1, 2022

(54) OPTICAL SEMICONDUCTOR DEVICE AND MANUFACTURING METHOD THEREOF

(71) Applicant: SUMITOMO ELECTRIC DEVICE INNOVATIONS, INC., Kanagawa (JP)

(72) Inventors: Kazuhiro Yamaji, Yokohama (JP); Takayuki Watanabe, Yokohama (JP)

(73) Assignee: SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 288 days.

(21) Appl. No.: 16/653,170

(22) Filed: Oct. 15, 2019

(65) Prior Publication Data

US 2020/0127439 A1 Apr. 23, 2020

(30) Foreign Application Priority Data

Oct. 17, 2018 (JP) ............................ JP2018-195767

(51) Int. Cl.
*H01S 5/12* (2021.01)
*H01S 5/026* (2006.01)

(52) U.S. Cl.
CPC .......... *H01S 5/1218* (2013.01); *H01S 5/0265* (2013.01); *H01S 5/1231* (2013.01)

(58) Field of Classification Search
CPC ..... H01S 5/1218; H01S 5/1231; H01S 5/0265
See application file for complete search history.

(56) References Cited

FOREIGN PATENT DOCUMENTS

| | | | | |
|---|---|---|---|---|
| EP | 0706243 A2 * | 4/1996 | ............... | H01S 5/12 |
| JP | H10-163568 | 6/1998 | | |
| JP | 2000137126 A * | 5/2000 | ............ | G02B 6/124 |

OTHER PUBLICATIONS

Machine translation of EP0706243A2 (Year: 1995).*
Machine translation of JP2000-137126 (Year: 2000).*

* cited by examiner

*Primary Examiner* — Yuanda Zhang
(74) *Attorney, Agent, or Firm* — Smith, Gambrell & Russell, LLP.

(57) ABSTRACT

A manufacturing method for an optical semiconductor device includes: forming a first semiconductor layer; forming a first mask pattern on the first semiconductor layer in a first area where an electro absorption type modulator is formed; forming an unevenness along the first direction on the first semiconductor layer; forming a second semiconductor layer on the unevenness; and forming an optical waveguide layer on the second semiconductor layer. The first mask pattern includes a first pattern in the first area and a second pattern in a second area where a DFB laser is formed, the first pattern including a first opening pattern and a first cover pattern, and the second pattern including a second opening pattern and a second cover pattern, and a ratio of the first opening pattern to the first cover pattern is different from that of the second opening pattern to the second cover pattern.

17 Claims, 8 Drawing Sheets

2 3A 4 R1 R2 R3 73 72 71 64 63 62 64 63 62 67 66 65 22 V31 T2 T4 T6 T8 T10 31 T1 T3 T5 T7 T9 61 26 V11 V12 V13 V21 51 56 21 Z X Y L12 L11 L14 L13 L16 L15 L18 L17

31
61
T10
T9
56
51
21
4
V21
67
65
66
L17
L18
T8
T7
3A
R3
64
62
63
L15
L16
V13
T6
T5
R2
64
62
63
L13
L14
V12
R1
T4
T3
V11
2
73
71
72
L11
L12
V31
T2
T1
26
22
Z
X
Y

OPTICAL SEMICONDUCTOR DEVICE AND MANUFACTURING METHOD THEREOF

CROSS REFERENCE TO RELATED APPLICATIONS

This application claims the benefit of priority from Japanese Application No. JP2018-195767 filed on Oct. 17, 2018, the entire contents of which are incorporated herein by references.

TECHNICAL FIELD

The present disclosure relates to an optical semiconductor device and a manufacturing method thereof.

BACKGROUND

Japanese Unexamined Patent Publication No. H10-163568, for example, discloses a modulator-integrated semiconductor laser having a semiconductor laser part and a modulator part integrated with each other.

SUMMARY

A manufacturing method for an optical semiconductor device according to an aspect of the present disclosure is a manufacturing method for an optical semiconductor device including an electro absorption type modulator, a DFB laser, and a connection area connected between the electro absorption type modulator and the DFB laser in an integrated structure in a first direction on a semiconductor substrate, the manufacturing method including: forming a first semiconductor layer on a semiconductor substrate; forming a first mask pattern on the first semiconductor layer in the connection area and a first area where the electro absorption type modulator is formed; forming an evenness along the first direction on the first semiconductor layer in the connection area using the first mask pattern; forming a second semiconductor layer on the unevenness provided on the first semiconductor layer; and forming an optical waveguide layer on the second semiconductor layer. The first mask pattern includes a first pattern in the first area and a second pattern in a second area where the DFB laser is formed, the first pattern including a first opening pattern and a first cover pattern adjacent to each other, and the second pattern including a second opening pattern and a second cover pattern adjacent to each other. A ratio of the first opening pattern to the first cover pattern is different from a ratio of the second opening pattern to the second cover pattern.

An optical semiconductor device according to an another aspect of the present disclosure includes a laser including: an electro absorption type modulator; a DFB laser; and a connection area connected between the electro absorption type modulator and the DFB laser in an integrated structure in a first direction on a semiconductor substrate; a first semiconductor layer having an unevenness extending in the first direction on the semiconductor substrate; a second semiconductor layer provided on the unevenness of the first semiconductor layer; an active layer provided on the second semiconductor layer; and an optical waveguide provided on the second semiconductor layer, the optical waveguide being arranged with the electro absorption type modulator and the connection area. A duty ratio of the unevenness in the connection area is greater on the DFB laser side than on the electro absorption type modulator side. The duty ratio of the unevenness corresponds to a ratio of a length of a projection to a total length of the projection and a depression adjacent to the projection.

A manufacturing method for an optical semiconductor device according to a still another aspect of the present disclosure is a manufacturing method for an optical semiconductor device including a laser area, a connection area, and an optical modulation area in turn disposed along an optical waveguide direction, the method including: forming a first semiconductor layer on a semiconductor substrate; forming a first mask pattern on the first semiconductor layer in the connection area; forming an unevenness along the optical waveguide direction on the first semiconductor layer in the connection area using the first mask pattern; forming a second semiconductor layer on the first semiconductor layer on which the unevenness is formed; and forming an optical waveguide layer on the second semiconductor layer. In the forming the first mask pattern, the first mask pattern is formed in which a ratio of a length of a cover pattern along the optical waveguide direction to a total length of an opening pattern and the cover pattern located in the connection area and adjacent to each other along the optical waveguide direction is greater on the laser area side than on the optical modulation area side, and in the forming the unevenness, the unevenness is formed in which a ratio of a length of a projection along the optical waveguide direction to a total length of a depression and the projection located in the connection area and adjacent to each other along the optical waveguide direction is greater on the laser area side than on the optical modulation area side.

BRIEF DESCRIPTION OF THE DRAWINGS

The foregoing and other purposes, aspects and advantages will be better understood from the following detailed description of a preferred embodiment of the disclosure with reference to the drawings, in which.

DETAILED DESCRIPTION

Figure 1A:
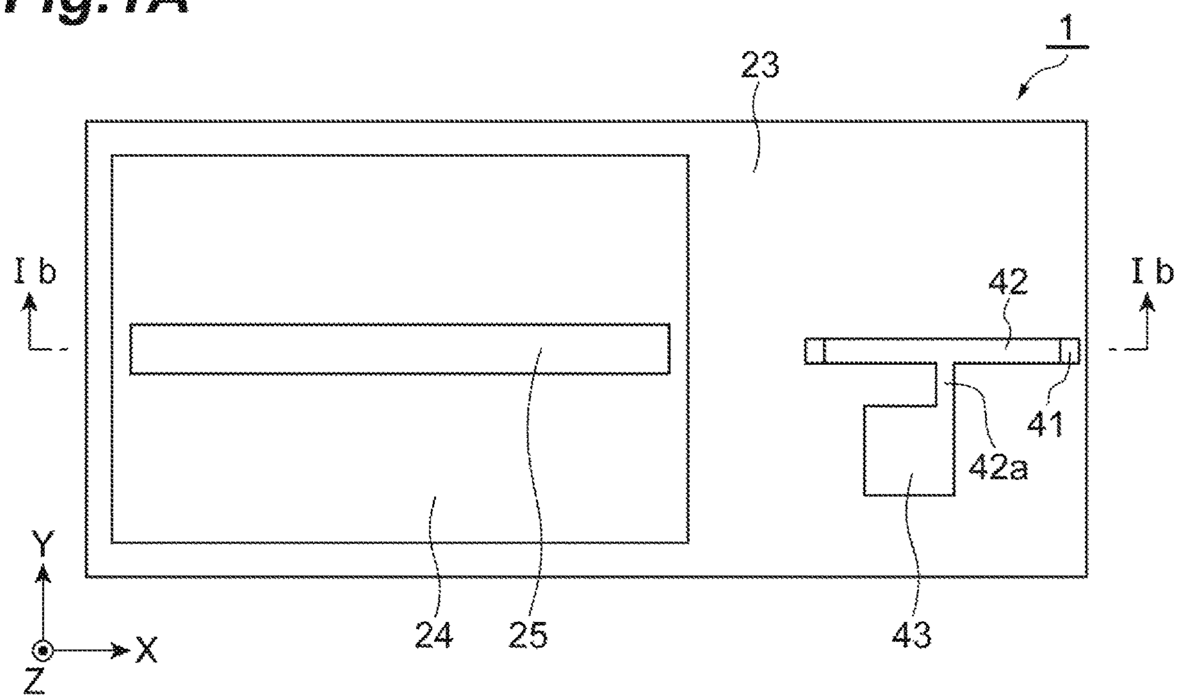
FIG. 1A is a schematic plan view showing a semiconductor laser device according to an embodiment.

Problem to be Solved by the Present Disclosure

The modulator-integrated semiconductor laser as shown in Japanese Unexamined Patent Publication No. H10-

163568, from the viewpoint of decreasing internal losses, generally, the optical waveguide (the active layer) of the semiconductor laser part (the laser area) is desirably thin. From the viewpoints of a high extinction ratio and a low capacity, the optical waveguide (the optical waveguide layer) of the modulator part (the optical modulation area) is desirably thick. However, a simple increase in the thickness of the optical waveguide layer more than the active layer easily causes light reflection due to a large step at an end face connecting part (Butt-Joint part) between the semiconductor laser part and the modulator part. Therefore, in a case in which the thickness of the active layer and the thickness of the optical waveguide layer are differently set, this might cause a reduction in the coupling efficiency of the semiconductor laser part to the modulator part.

Description of an Embodiment of the Present Disclosure

An embodiment of the present disclosure is a manufacturing method for a semiconductor laser device including a laser area, a connection area, and an optical modulation area in turn disposed along an optical waveguide direction, the manufacturing method including: forming a first semiconductor layer on a semiconductor substrate; forming a first mask pattern on the first semiconductor layer in the connection area; forming an unevenness along the optical waveguide direction on the first semiconductor layer in the connection area using the first mask pattern; forming a second semiconductor layer on the first semiconductor layer on which the unevenness is formed; and forming an optical waveguide layer on the second semiconductor layer. In the forming the first mask pattern, the first mask pattern is formed in which a ratio of a length of a cover pattern along the optical waveguide direction to a total length of an opening pattern and the cover pattern located in the connection area and adjacent to each other along the optical waveguide direction is greater on the laser area side than on the optical modulation area side, and in the forming the unevenness, the unevenness is formed in which a ratio of a length of a projection along the optical waveguide direction to a total length of a depression and the projection located in the connection area and adjacent to each other along the optical waveguide direction is greater on the laser area side than on the optical modulation area side.

In the manufacturing method, the unevenness along the optical waveguide direction is formed on the first semiconductor layer in the connection area using the first mask pattern. In the formed unevenness, the ratio of the length of the projection along the optical waveguide direction to the total length of the depression and the projection adjacent to each other located in the connection area along the optical waveguide direction is greater on the laser area side than on the optical modulation area side. Here, in the growth of the second semiconductor layer on the first semiconductor layer on which the unevenness is formed, the capacity of the depression is greater in the region where the ratio is smaller, and hence the thickness of the second semiconductor layer becomes thinner. Therefore, the thickness of the second semiconductor layer located in the connection area is thinner on the optical modulation area side than on the laser area side in the optical waveguide direction. Thus, even in the case in which the optical waveguide layer thicker than the active layer is formed, forming a large step on the end face connecting part between the active layer and the optical waveguide layer can be suppressed. Therefore, according to the manufacturing method, a semiconductor laser device can be manufactured in which the thickness of the optical waveguide layer in the optical modulation area can be set greater than the thickness of the active layer in the laser area, while the degradation of the coupling efficiency of the laser area to the optical modulation area is suppressed.

The manufacturing method may further include: forming diffraction grating layer on the first semiconductor layer; and removing a portion of the diffraction grating layer located in the connection area and in the optical modulation area to expose the first semiconductor layer. In the manufacturing method, in the forming the first mask pattern, the first mask pattern may be formed also on the diffraction grating layer, and in the forming the unevenness on the first semiconductor layer, diffraction gratings may be formed using the first mask pattern. In this case, in forming the unevenness on the first semiconductor layer, diffraction gratings can be formed in the laser area, for example. Therefore, a semiconductor laser device that can achieve stable single-mode oscillation can be manufactured.

The ratio of the length of the projection to the total length of the depression and the projection may continuously change or may change step by step along the optical waveguide direction. In this case, the thickness of the second semiconductor layer located in the connection area becomes continuously thinner or becomes thinner step by step from the laser area side toward the optical modulation area side along the optical waveguide direction. Therefore, the thickness of the optical waveguide layer located in the connection area can be made continuously thicker or made thicker step by step from the laser area side toward the optical modulation area side along the optical waveguide direction. Accordingly, no step is provided on the optical waveguide layer located in the connection area, or forming a large step on the optical waveguide layer can be suppressed, and hence the degradation of the coupling efficiency of the laser area to the optical modulation area can be preferably suppressed.

In the forming the optical waveguide layer, the optical waveguide layer may be formed in an opening using a second mask pattern having the opening overlapping with a part of the second semiconductor layer, and a pattern width of a region of the opening located in the connection area may be narrower as closer to the optical modulation area in the optical waveguide direction. In this case, the growth rate of the optical waveguide layer around the laser area with a wide pattern width becomes small. Therefore, forming a large step on the end face connecting part between the active layer and the optical waveguide layer can be excellently suppressed, and hence the degradation of the coupling efficiency of the laser area to the optical modulation area can be preferably suppressed.

The second mask pattern may have a pair of openings different from the opening, the pair of openings different from the opening may overlap with the second semiconductor layer, and the opening may be located between the pair of openings different from the opening in a direction intersecting with the optical waveguide direction in a plan view. In this case, on the second semiconductor layer, a semiconductor layer constituting the optical waveguide layer is grown not only in the opening but also in the pair of openings different from the opening. Therefore, the growth rate of the optical waveguide layer in the opening becomes further smaller. Therefore, the film quality of the optical waveguide layer can be further improved as well as the thickness of the optical waveguide layer can be preferably controlled. Accordingly, the active layer can be connected to the optical waveguide layer without the occurrence of a sudden change in the refractive index.

Another embodiment of the present disclosure is a semiconductor laser device including a laser area, a connection area, and an optical modulation area in turn disposed on a semiconductor substrate along an optical waveguide direction, the semiconductor laser device including: a first semiconductor layer provided on the semiconductor substrate, the first semiconductor layer having an unevenness along the optical waveguide direction on a first portion; a second semiconductor layer provided on the unevenness of the first semiconductor layer; an active layer provided on the second semiconductor layer located in the laser area; and an optical waveguide layer provided on the second semiconductor layer located in the connection area and in the optical modulation area. In the semiconductor laser device, a duty ratio of the unevenness located in the connection area is greater on the laser area side than on the optical modulation area side, a duty ratio of the unevenness located in the optical modulation area is constant, and is equal to or less than a minimum value of the duty ratio of the unevenness located in the connection area, and the duty ratio is a ratio of a length of a projection along the optical waveguide direction to a total length of a depression and the projection adjacent to each other along the optical waveguide direction.

In this semiconductor laser device, in the unevenness provided on the first semiconductor layer, the ratio of the length of the projection along the optical waveguide direction to the total length of the depression and the projection adjacent to each other located in the connection area along the optical waveguide direction is greater on the laser area side than on the optical modulation area side. Here, in the thickness of the second semiconductor layer grown on the first semiconductor layer on which the unevenness is formed, the capacity of the depression is greater in the region where the duty ratio is smaller, and hence the thickness of the second semiconductor layer becomes thinner. Therefore, the thickness of the second semiconductor layer located in the connection area is thinner on the optical modulation area side than on the laser area side in the optical waveguide direction. Thus, the semiconductor laser device can include the optical waveguide layer thicker than the active layer, while forming a large step on the end face connecting part between the active layer and the optical waveguide layer is suppressed. Accordingly, a semiconductor laser device can be obtained in which the thickness of the optical waveguide layer in the optical modulation area can be set greater than the thickness of the active layer in the laser area, while the degradation of the coupling efficiency of the laser area to the optical modulation area is suppressed.

The duty ratio of the unevenness located in the connection area may continuously change or may change step by step along the optical waveguide direction. In this case, the thickness of the second semiconductor layer located in the connection area becomes continuously thinner or becomes thinner step by step from the laser area side toward the optical modulation area side along the optical waveguide direction. Therefore, the thickness of the optical waveguide layer located in the connection area can be made continuously thicker or made thicker step by step from the side of the laser area toward the side of the optical modulation area along the optical waveguide direction. Accordingly, no step is provided on the optical waveguide layer located in the connection area, or forming a large step on the optical waveguide layer can be suppressed, and hence the degradation of the coupling efficiency of the laser area to the optical modulation area can be preferably suppressed.

A height of a top face of the active layer and a height of a top face of the optical waveguide layer may be equal. In this case, no step is provided on the top faces of the active layer and the optical waveguide layer, and hence the degradation of the coupling efficiency of the laser area to the optical modulation area can be preferably suppressed.

Effect of the Embodiment of the Present Disclosure

According to embodiments of the present disclosure, a semiconductor laser device and a manufacturing method thereof can be provided in which the thickness of the optical waveguide layer in the optical modulation area can be set greater than the thickness of the active layer in the laser area, while the degradation of the coupling efficiency of the laser area to the optical modulation area is suppressed.

Description of Embodiments of the Present Disclosure

Specific examples of a semiconductor laser device and manufacturing method thereof according to an embodiment of the present disclosure will be described below with reference to the drawings. Further, it is to be understood that the present disclosure is not limited to these examples but is defined by the scope of the claims and includes all modifications within the meaning and scope equivalent to the claims. In the following description, the same elements are denoted by the same reference numerals in the description of the drawings, and redundant explanations are omitted.

Figure 1B:
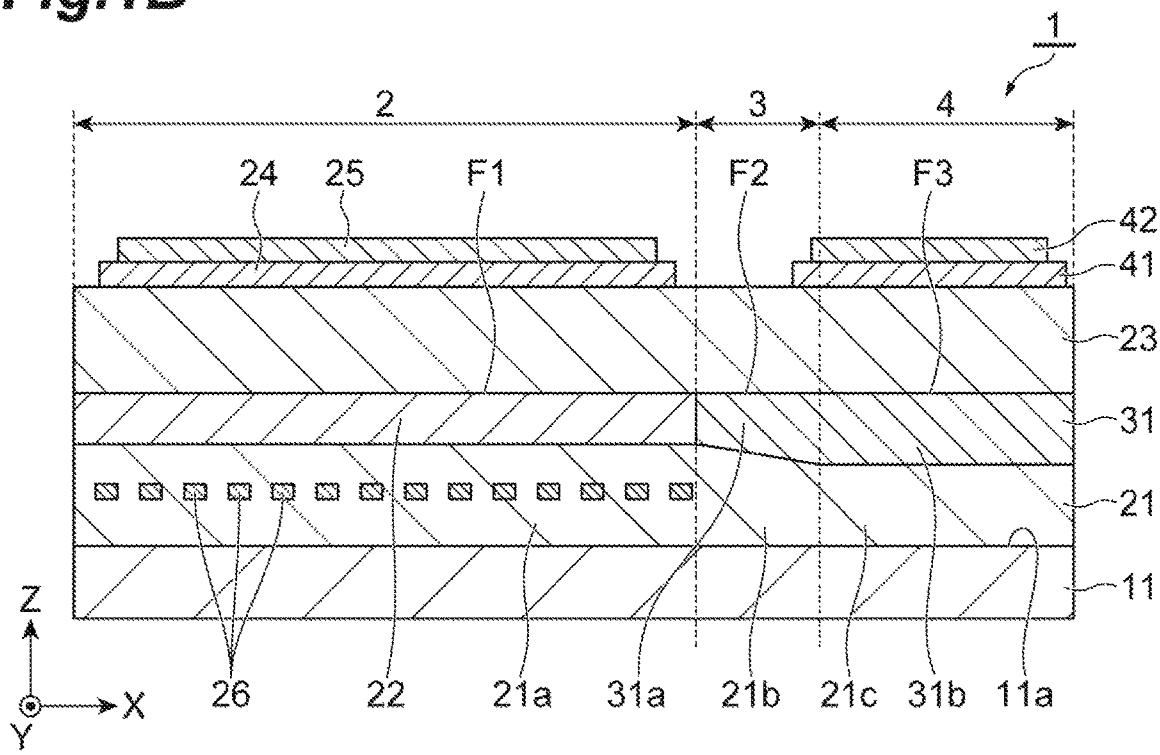
FIG. 1B is a cross-sectional view taken along line Ib-Ib in FIG. 1A.

FIG. 1A is a schematic plan view showing a semiconductor laser device according to an embodiment, and FIG. 1B is a cross-sectional view taken along line Ib-Ib in FIG. 1A. A semiconductor laser device 1 (optical semiconductor device) shown in FIGS. 1A and 1B is a laser device formed on a semiconductor substrate 11, and includes a laser area 2, a connection area 3, and an optical modulation area 4. The laser area 2, the connection area 3, and the optical modulation area 4 are in turn disposed along one direction on a main face 11*a* on the semiconductor substrate 11. In the embodiment, the laser area 2, the connection area 3, and the optical modulation area 4 are monolithically formed on the semiconductor substrate 11. The one direction is the propagation direction (the optical waveguide direction) of light oscillated by the semiconductor laser device 1. In the following, the one direction is a direction X (an optical waveguide direction). In the following, the direction orthogonal to the direction X in the horizontal direction is a direction Y (the width direction), and the vertical direction orthogonal to the horizontal direction is a direction Z (the thickness direction). The semiconductor laser device 1 in a plan view corresponds to the semiconductor laser device 1 viewed from the direction Z.

The semiconductor substrate 11 is the seed substrate of semiconductor layers included in the laser area 2 and the like, and is an n-type semiconductor substrate including InP, for example. On the back surface of the semiconductor substrate 11, a back-side electrode having a conductive material, such as a metal, may be provided.

The laser area 2 is a portion that oscillates laser light in the semiconductor laser device 1, and has a lower cladding layer 21, an active layer 22, an upper cladding layer 23, a contact layer 24, and an electrode 25. The lower cladding layer 21, the active layer 22, the upper cladding layer 23, the contact layer 24, and the electrode 25 are in turn stacked on the main face 11*a* of the semiconductor substrate 11. The lower cladding layer 21 and the upper cladding layer 23 are also included in the connection area 3 and the optical modulation area 4.

The lower cladding layer 21 is a layer that confines light between the inside of the active layer 22 and the inside of an optical waveguide layer 31, described later. The lower cladding layer 21 is a compound semiconductor layer, and exhibits an n-type, for example, including InP. The thickness of the lower cladding layer 21 located in the laser area 2 (i.e., a portion 21*a* of the lower cladding layer 21 located in the laser area 2) is 700 nm or more and 1,200 nm or less, for example. The thickness of the portion 21*a* of the lower cladding layer 21 is constant. Note that in the embodiment, the term "constant", the term "the same", and any other term may include a margin of errors. A margin of errors is ±5%, for example.

The portion 21*a* of the lower cladding layer 21 is provided with diffraction gratings 26 configured to feed back light at a specific wavelength to the active layer 22 in a distribution manner. These diffraction gratings 26 are formed in the laser area 2, and hence stable single-mode oscillation can be achieved. Thus, the semiconductor laser device 1 functions as a distributed feedback semiconductor laser (DFB laser). The diffraction gratings 26 include a refractive index different from the refractive index of the lower cladding layer 21. In the case in which the lower cladding layer 21 is an InP semiconductor layer, for example, a material constituting the diffraction gratings 26 is InGaAsP, for example.

The active layer 22 is an optical waveguide layer that can obtain gains by current injection, and is the core of the semiconductor laser device 1. The active layer 22 is a compound semiconductor layer having a quantum well structure including InGaAsP, for example. As an example of the quantum well structure, a structure is adapted in which a well layer made of InGaAsP and a barrier layer made of InGaAsP having its composition different from the composition of InGaAsP of the well layer are alternately stacked. The thickness of the active layer 22 is 180 nm or more and 220 nm or less, for example.

The upper cladding layer 23 is a layer that confines light between the inside of the active layer 22 and the inside of the optical waveguide layer 31, described later, together with the lower cladding layer 21. The upper cladding layer 23 is a compound semiconductor layer, and exhibits the p-type, for example, including InP. The thickness of the upper cladding layer 23 is constant, and is 1,500 nm or more and 2,000 nm or less, for example.

The contact layer 24 is a compound semiconductor layer in ohmic contact with the electrode 25, and is a p-type InGaAsP layer, for example. The electrode 25 is a conductive layer to which a direct current to oscillate laser light is supplied, and is provided on the contact layer 24.

The connection area 3 is a portion that connects the laser area 2 to the optical modulation area 4 in the direction X, and has the lower cladding layer 21, the optical waveguide layer 31, and the upper cladding layer 23. The lower cladding layer 21, the optical waveguide layer 31, and the upper cladding layer 23 are in turn stacked on the main face 11*a* of the semiconductor substrate 11. The optical waveguide layer 31 are also included in the optical modulation area 4.

The thickness of the lower cladding layer 21 located in the connection area 3 (i.e., a portion of the lower cladding layer 21 21*b* located in the connection area 3) is thinner on the optical modulation area 4 side than on the laser area 2 side in the direction X. The thickness of the portion 21*b* is 600 nm or more and 1,100 nm or less, for example. In the embodiment, in the portion 21*b* of the lower cladding layer 21, the thickness of the end portion on the laser area 2 side is the thickest, the thickness of the end portion on the optical modulation area 4 side is the thinnest. The portion 21*b* is continuously thinner from the laser area 2 side to the optical modulation area 4 side in the direction X. That is, the thickness of the portion 21*b* is decreased from the laser area 2 side to the optical modulation area 4 side at a constant ratio in the direction X.

The optical waveguide layer 31 is the core of the semiconductor laser device 1 similarly to the active layer 22, and is a compound semiconductor layer extending along the direction X. The optical waveguide layer 31 has a quantum well structure including InGaAsP, for example. In the direction X, the optical waveguide layer 31 and the active layer 22 are optically coupled to each other. Specifically, the end face of the optical waveguide layer 31 on the laser area 2 side is coupled with the end face of the active layer 22 on the connection area 3 side. Thus, the semiconductor laser device 1 is provided with the end face connecting part between the active layer 22 and the optical waveguide layer 31. The thickness of the optical waveguide layer 31 located in the connection area 3 (i.e., a portion 31*a* of the optical waveguide layer 31 located in the connection area 3) is thicker on the optical modulation area 4 side than on the laser area 2 side in the direction X. The thickness of the portion 31*a* is 180 nm or more and 300 nm or less, for example. In the embodiment, in the portion 31*a* of the optical waveguide layer 31, the thickness of the end portion on the laser area 2 side is thinnest, and the thickness of the end portion on the optical modulation area 4 side is the thickest. The portion 31*a* is continuously thicker from the laser area 2 side to the optical modulation area 4 side in the direction X. In addition to this, the height of a top face F2 of the portion 31*a* is the same as the height of a top face F1 of the active layer 22. Therefore, the thickness of the upper cladding layer 23 located in the connection area 3 is the same as the thickness of the upper cladding layer 23 located in the laser area 2.

The optical modulation area 4 is the portion in which oscillated laser light is modulated, and has the lower cladding layer 21, the optical waveguide layer 31, the upper cladding layer 23, a contact layer 41, and an electrode 42. The lower cladding layer 21, the optical waveguide layer 31, the upper cladding layer 23, the contact layer 41, and the electrode 42 are in turn stacked on the main face 11*a* of the semiconductor substrate 11.

The thickness of the lower cladding layer 21 located in the optical modulation area 4 (i.e., a portion 21*c* of the lower cladding layer 21 located in the optical modulation area 4) is equal to or less than the thickness of the portion 21*b* in the connection area 3. In the embodiment, the thickness of the portion 21*c* of the lower cladding layer 21 corresponds to the thickness of the end portion on the optical modulation area 4 side in the portion 21*b* of the lower cladding layer 21. The thickness of the portion 21*c* is constant.

The optical waveguide layer 31 located in the optical modulation area 4 (i.e., a portion 31*b* of the optical waveguide layer 31 located in the optical modulation area 4) can absorb light oscillated in the laser area 2, and can also be designated with a light absorption layer. The thickness of the portion 31*b* of the optical waveguide layer 31 is equal to or more than the thickness of the portion 31*a* of the connection area 3. In the embodiment, the thickness of the portion 31*b* corresponds to the thickness of the end portion on the optical modulation area 4 side in the portion 31*a* of the connection area 3. The height of a top face F3 of the portion 31*b* is the same as the height of the top face F1 of the active layer 22 similarly to the portion 31*a*. Therefore, the thickness of the upper cladding layer 23 located in the optical modulation area 4 is the same as the thickness of the upper cladding layer 23 located in the laser area 2 and the connection area 3.

The contact layer 41 is a compound semiconductor layer in ohmic contact with the electrode 42, and is a p-type InGaAsP layer, for example. The contact layer 41 is apart from the contact layer 24. An insulating film may be provided between the contact layers 24 and 41. In this case, the contact layers 24 and 41 can be excellently insulated from each other.

The electrode 42 is a conductive layer to which a signal for modulating laser light is supplied, and is provided on the contact layer 41. The electrode 42 is connected to a pad 43 through a wiring part 42*a*, for example. The wiring part 42*a* is a portion extending from a part of the electrode 42 along the direction Y. The pad 43 is a conductive layer to which a wire to which a signal is supplied, for example, is bonded.

An insulating film may be formed on both end faces of the semiconductor laser device 1 in the direction X. Specifically, a configuration may be provided in which a high reflection film is formed on the end face of the semiconductor laser device 1 on the laser area 2 side and an antireflection film may be formed on the end face of the semiconductor laser device 1 on the optical modulation area 4 side. In this semiconductor laser device 1, the supply of a direct current to the electrode 25 causes laser oscillation in the active layer 22. The laser light oscillated and amplified in the active layer 22 is modulated in the optical waveguide layer 31 in the optical modulation area 4. The modulated laser light is output from the optical modulation area 4 to the outside.

Next, a manufacturing method for a semiconductor laser device according to the embodiment will be described with reference to FIGS. 2A to 5B. FIGS. 2A to 2C, FIGS. 3A to 3C, FIGS. 4A to 4C, and FIGS. 5A and 5B are diagrams illustrating a manufacturing method for the semiconductor laser device 1 according to an embodiment. FIG. 2C, FIGS. 3A to 3C, FIGS. 4A to 4C, and FIGS. 5A and 5B show a region that is finally the laser area 2, a region that is finally the connection area 3, and a region that is finally the optical modulation area 4 for explanation.

Figure 2A:
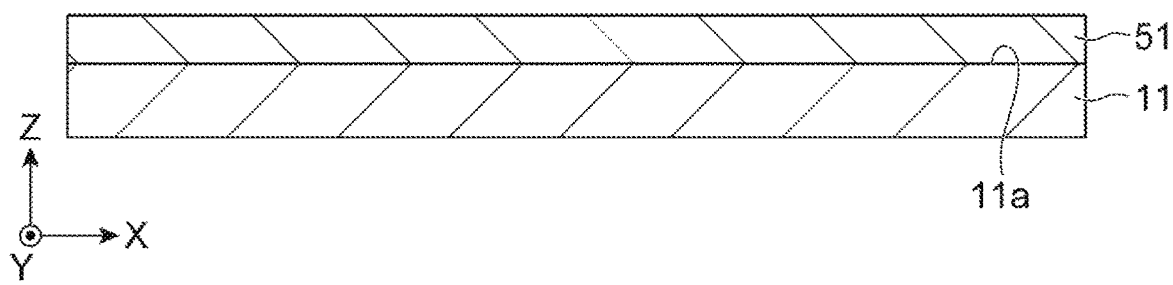
FIGS. 2A to 2C are diagrams illustrating a manufacturing method for the semiconductor laser device according to the embodiment.

First, as shown in FIG. 2A, a first semiconductor layer 51 is formed on the main face 11*a* of the semiconductor substrate 11 (a first step). In the first step, the first semiconductor layer 51 is epitaxially grown on the main face 11*a* by metal organic chemical vapor deposition, for example. The first semiconductor layer 51 is an n-type InP layer, for example. The thickness of the first semiconductor layer 51 is 500 nm or more and 1,000 nm or less, for example.

Figure 2B:
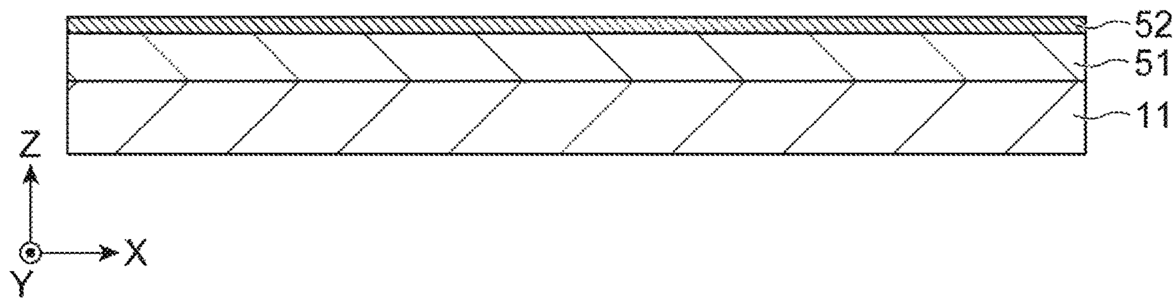

Subsequently, as shown in FIG. 2B, diffraction grating layer 52 is formed on the first semiconductor layer 51 (a second step). In the second step, the diffraction grating layer 52 is epitaxially grown on the first semiconductor layer 51 by metal organic chemical vapor deposition, for example. The diffraction grating layer 52 is an InGaAsP layer, for example. The thickness of the diffraction grating layer 52 is 50 nm or more and 100 nm or less, for example.

Figure 2C:
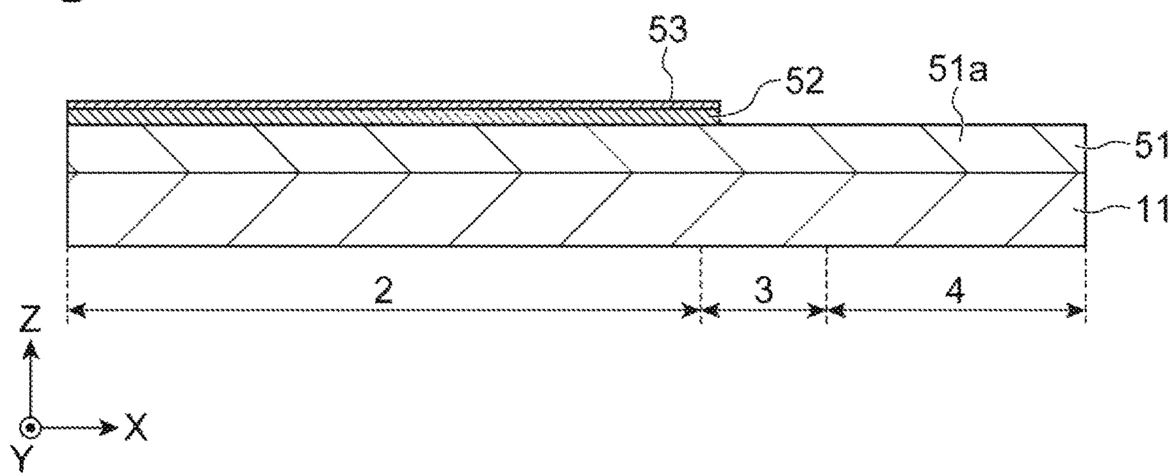

Subsequently, as shown in FIG. 2C, a part of the diffraction grating layer 52 is removed (a third step). In the third step, a portion of the diffraction grating layer 52 located in the connection area 3 and the optical modulation area 4 is removed to expose the first semiconductor layer 51. Specifically, first, a mask 53 is formed on the portion of the diffraction grating layer 52 located in the laser area 2. Subsequently, a part of the diffraction grating layer 52 is removed using the mask 53. Thus, a first portion 51*a* of the first semiconductor layer 51 located in the connection area 3 and the optical modulation area 4 is exposed from the diffraction grating layer 52. A part of the diffraction grating layer 52 corresponds to the portion of the diffraction grating layer 52 exposed from the mask 53, and removed by dry etching, for example. The mask 53 covering a part of the diffraction grating layer 52 is a photoresist that exhibits a film shape, for example.

Figure 3A:
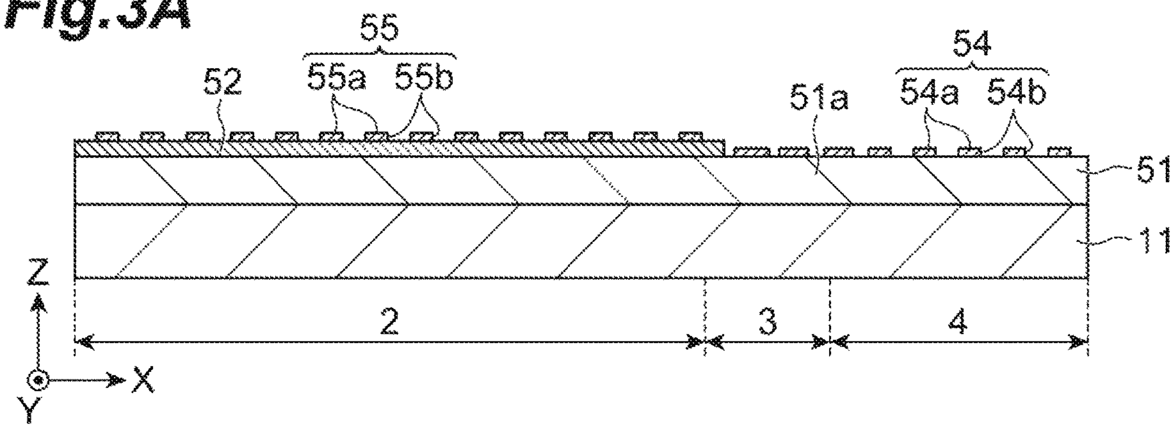
FIGS. 3A to 3C are diagrams illustrating a manufacturing method for the semiconductor laser device according to the embodiment.

Subsequently, as shown in FIG. 3A, a mask pattern 54 is formed on the first portion 51*a* of the first semiconductor layer 51, and a mask pattern 55 is formed on the remaining diffraction grating layer 52 (a fourth step). In the fourth step, the mask pattern 54 and the mask pattern 55 are formed by photolithography, for example. The mask pattern 54 and the mask pattern 55 are patterned photoresists, for example. In the embodiment, on the first semiconductor layer 51 at least in the connection area 3, the mask pattern 54 is formed. Note that the mask patterns 54 and 55 are formed at the same time. Therefore, the mask patterns 54 and 55 can also be interpreted as the same first mask patterns, for example.

The mask pattern 54 has a cover pattern 54*a* covering the first portion 51*a* of the first semiconductor layer 51 and a plurality of opening patterns 54*b*. The plurality of opening patterns 54*b* is periodically provided along the direction X. Thus, on the first portion 51*a*, the cover pattern 54*a* and the opening pattern 54*b* are alternately located in the direction X. In the plurality of opening patterns 54*b*, the length of a part of opening patterns 54*b* along the direction X is different from the others. Specifically, the length of the opening pattern 54*b* located in the connection area 3 along the direction X is longer on the optical modulation area 4 side than on the laser area 2 side. In the embodiment, the length of the opening pattern 54*b* located in the connection area 3 along the direction X is longer on the optical modulation area 4 side in the direction X, and is 40 nm or more and 110 nm or less, for example. On the other hand, the lengths of the opening patterns 54*b* located in the optical modulation area 4 along the direction X are the same, and are 90 nm or more and 110 nm or less, for example. At the portion of the mask pattern 54 located in the optical modulation area 4, the length of the cover pattern 54*a* sandwiched between the adjacent opening patterns 54*b* along the direction X and the length of the opening pattern 54*b* along the direction X are the same.

The mask pattern 55 has a cover pattern 55*a* covering the diffraction grating layer 52 and a plurality of opening patterns 55*b*. The plurality of opening patterns 55*b* is periodically provided along the direction X. Thus, on the diffraction grating layer 52, the cover pattern 55*a* and the opening pattern 55*b* are alternately located in the direction X. The lengths of the opening patterns 55*b* along the direction X are the same, and are 99 nm or more and 101 nm or less, for example. The length of the cover pattern 55*a* sandwiched between the adjacent opening patterns 55*b* along the direction X and the length of the opening pattern 55*b* along the direction X are the same.

Figure 3B:
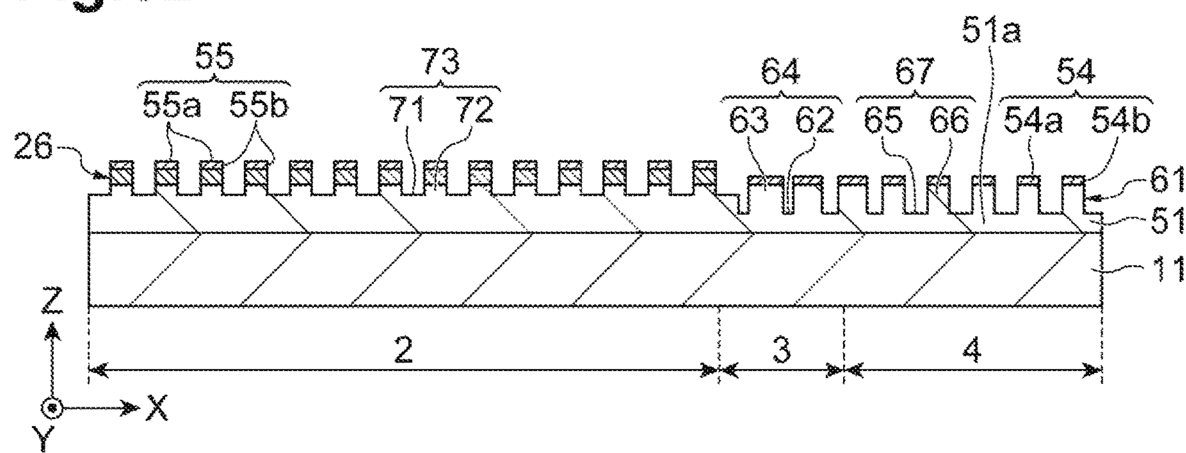

Subsequently, as shown in FIG. 3B, an unevenness 61 along the direction X is formed on the first portion 51*a* using the mask pattern 54, and the diffraction gratings 26 are formed using the mask pattern 55 (a fifth step). In the fifth step, the place where the mask pattern 54 is exposed in the first portion 51*a* and the place where the mask pattern 55 is exposed in the diffraction grating layer 52 are etched. Thus, the unevenness 61 and the diffraction gratings 26 each having the periodical structure along the direction X are formed. In the embodiment, the unevenness 61 is formed on the first semiconductor layer 51 at least in the connection area 3.

The unevenness 61 is a group of the depression and the projection alternately formed on the surface of the first portion 51*a* along the direction X. In the following, in the unevenness 61, the depression located in the connection area 3 is a depression 62, the projection located in the connection area 3 is a projection 63, and a set of the depression 62 and the projection 63 adjacent to each other an unevenness 64. The depression located in the optical modulation area 4 is a depression 65, the projection located in the optical modulation area 4 is a projection 66, and a set of the depression 65 and the projection 66 adjacent to each other is an unevenness 67. The lengths of the depressions 62 and 65 and the projections 63 and 66 along the direction X are 40 nm or more and 160 nm or less, for example. The depths of the depressions 62 and 65 (or the amounts of projection of the projections 63 and 66) are the same, and are 250 nm or more and 300 nm or less, for example.

In the following, a set of the depression and the projection adjacent to each other is an unevenness. The ratio (b/(a+b)) of a length b of the projection along the direction X to the total of a length a of the depression along the direction X and the length b is defined as the duty ratio of the unevenness. Therefore, the duty ratio of the unevenness is smaller, as the length of the depression along the direction X is longer. As described above, in the mask pattern 54, the length of the opening pattern 54*b* located in the connection area 3 along the direction X is longer on the optical modulation area 4 side than on the laser area 2 side. Therefore, in the unevenness 61, the duty ratio of the unevenness 64 located in the connection area 3 is greater on the laser area 2 side than on the optical modulation area 4 side. Similarly, the ratio of the length of the cover pattern 54*a* along the direction X to the total length of the cover pattern 54*a* and the opening pattern 54*b* located in the connection area 3 and adjacent to each other along the direction X is greater on the laser area 2 side than on the optical modulation area 4 side. In the embodiment, the duty ratio of the unevenness 64 continuously changes along the direction X. The duty ratio of the unevenness 64 is 0.5 or more and 1 or less.

As described above, at the portion of the mask pattern 54 located in the optical modulation area 4, the length of the cover pattern 54*a* sandwiched between the adjacent opening patterns 54*b* along the direction X and the length of the opening pattern 54*b* along the direction X are the same. Therefore, in the unevenness 61, the duty ratio of the unevenness 67 located in the optical modulation area 4 is constant, which is 0.5. That is, the duty ratio of the unevenness 67 is equal to or less than the minimum value of the duty ratio of the unevenness 64. Note that in the case in which the duty ratio of the unevenness 64 is 1, the unevenness 64 has no depression 62. Therefore, no unevenness may be formed on a part of the unevenness 61 in the embodiment.

In the fifth step, in the first semiconductor layer 51, a part of the portion located in the laser area 2 is also etched. Thus, in the laser area 2, a depression 71 from which the InGaAsP layer forming the diffraction gratings 26 are removed and a projection 72 including the InGaAsP layer are provided. As described above, in the mask pattern 55, the length of the cover pattern 55*a* sandwiched between the adjacent opening patterns 55*b* along the direction X and the length of the opening pattern 55*b* along the direction X are the same. Therefore, the length of the depression 71 along the direction X and the length of the projection 72 along the direction X are also the same. Accordingly, the duty ratio of the unevenness 73 configured of the depression 71 and the projection 72 adjacent to each other is 0.5. The length of the unevenness 73 along the direction X is 198 nm or more and 202 nm or less, for example.

Figure 3C:
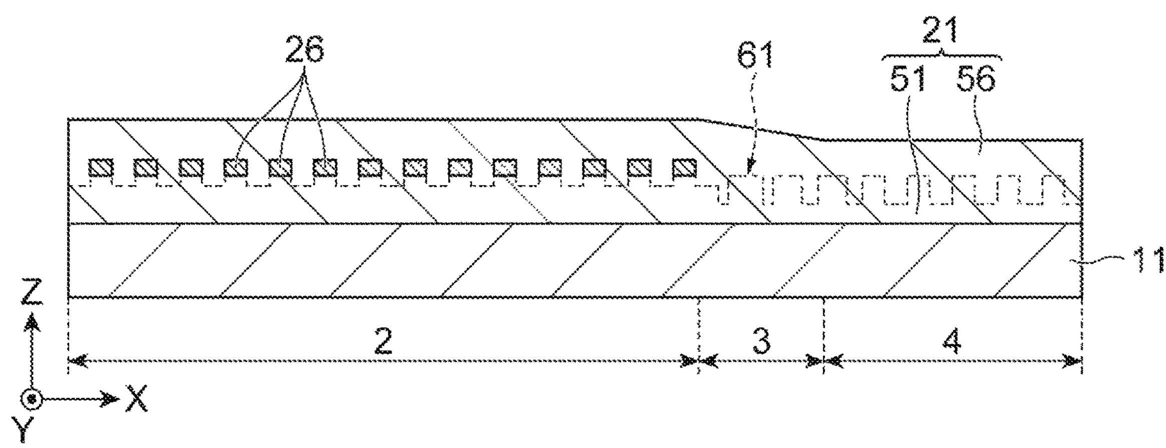

Subsequently, as shown in FIG. 3C, on the first semiconductor layer 51 where the first portion 51*a* is formed, the second semiconductor layer 56 is formed (a sixth step). In the sixth step, first, the mask pattern 55 and the mask pattern 54 are removed. Subsequently, the second semiconductor layer 56 that is an n-type InP layer, for example, is epitaxially grown on the diffraction gratings 26 and on the first portion 51*a* by metal organic chemical vapor deposition, for example. The thickness of the second semiconductor layer 56 is 100 nm or more and 200 nm or less, for example. After the sixth step, the first semiconductor layer 51 and the second semiconductor layer 56 are integrated with each other, and hence the lower cladding layer 21 in which the diffraction gratings 26 are buried is formed. The unevenness 61 is buried with the second semiconductor layer 56, and disappeared.

Figure 6:
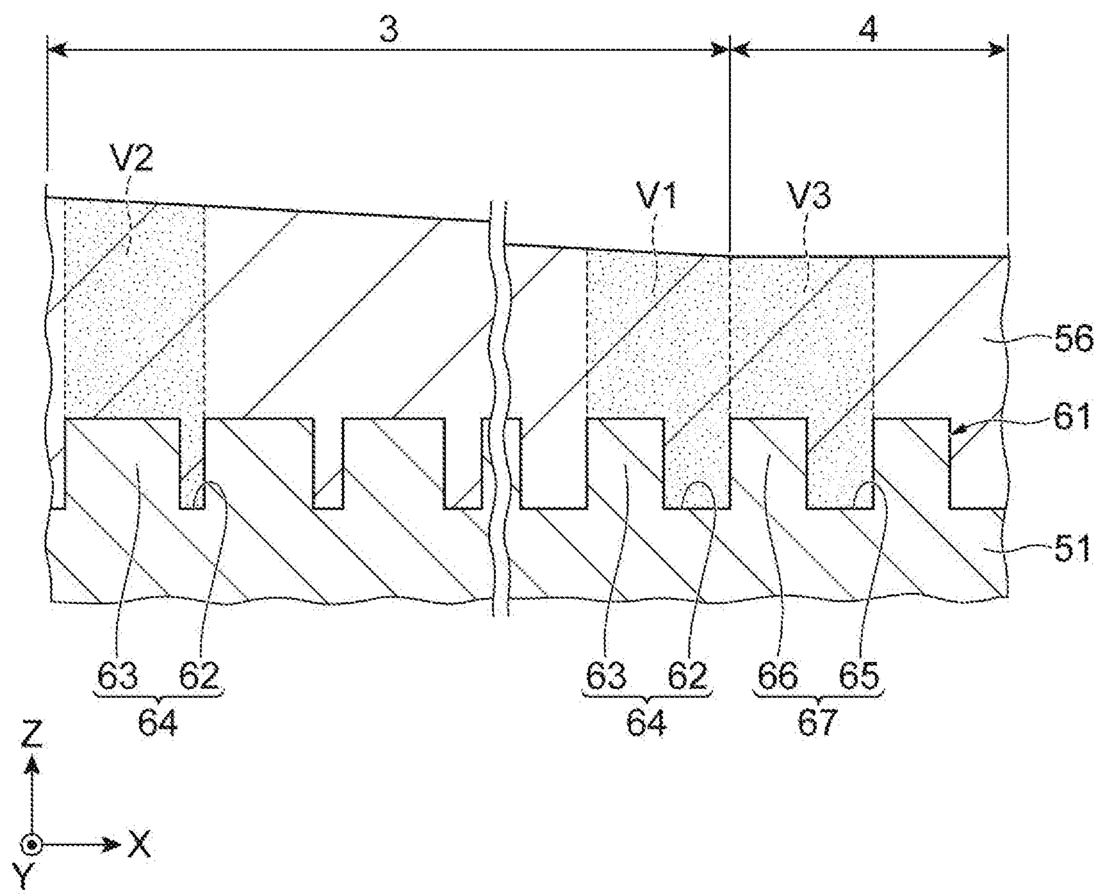
FIG. 6 is an enlarged cross-sectional view showing the main components of a connection area and an optical modulation area after a sixth step.

FIG. 6 is an enlarged cross-sectional view showing the main components of the connection area 3 and the optical modulation area 4 after the sixth step. In FIG. 6, the unevenness 61, the depressions 62 and 65, the projections 63 and 66, and the unevenness 64 and 67 are depicted by solid lines for explanation. As shown in FIG. 6, the thickness of the second semiconductor layer 56 grown in the connection area 3 is thinner as closer to the optical modulation area 4 side in the direction X. The thickness of the second semiconductor layer 56 grown in the optical modulation area 4 is constant, and is equal to or less than the minimum value of the thickness of the second semiconductor layer 56 located in the connection area 3. The volume of the second semiconductor layer 56 provided on the unevenness 64 located in the connection area 3 may be all the same. For example, in the connection area 3, volumes V1 and V2 of the second semiconductor layer 56 provided on the different unevenness 64 may be the same. The volume V1 and a volume V3 of the second semiconductor layer 56 provided on the unevenness 67 located in the optical modulation area 4 may be the same.

Figure 4A:
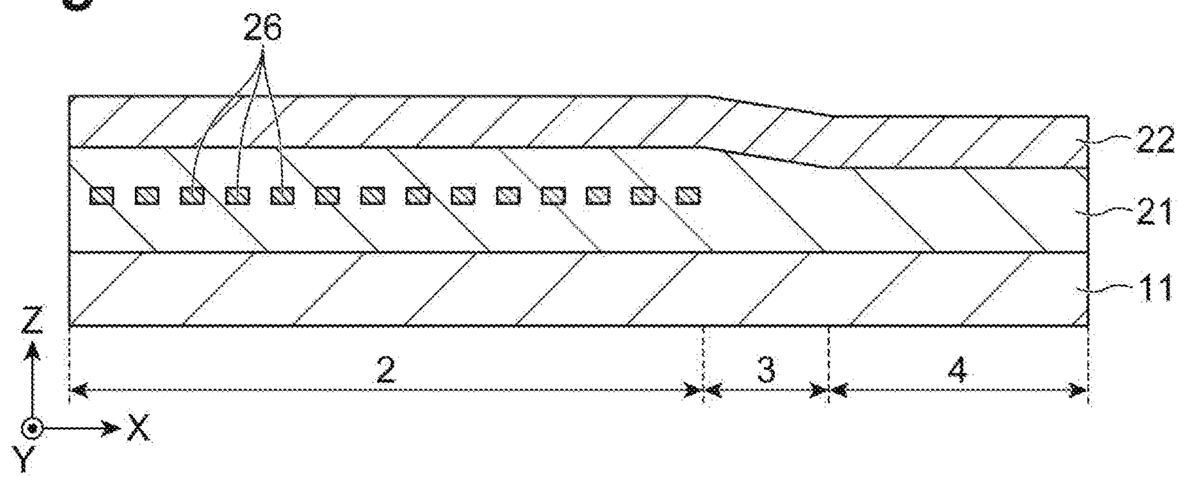
FIGS. 4A to 4C are diagrams illustrating a manufacturing method for the semiconductor laser device according to the embodiment.

Subsequently, as shown in FIG. 4A, the active layer 22 is formed on the second semiconductor layer 56 (the seventh step). In the seventh step, the active layer 22 having a quantum well structure is epitaxially grown by metal organic chemical vapor deposition, for example. At the point in time of the seventh step, the active layer 22 is provided in the laser area 2 as well as in the connection area 3 and in the optical modulation area 4.

Figure 4B:
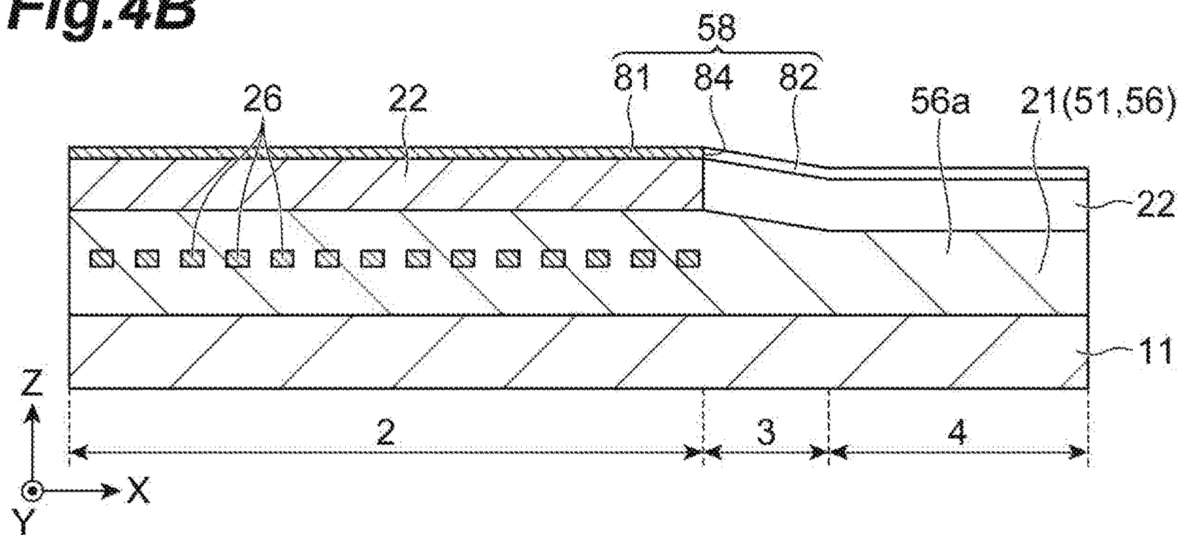

Subsequently, as shown in FIG. 4B, the portion of the active layer 22 located in the connection area 3 and the optical modulation area 4 is removed (an eighth step). In the eighth step, first, a mask pattern 58 (a second mask pattern) is formed on the active layer 22. Subsequently, the portion of the active layer 22 located in the connection area 3 and the optical modulation area 4 is removed using the mask pattern 58. Thus, the active layer 22 remains in the laser area 2. In the connection area 3 and in the optical modulation area 4, a second portion 56*a* of the second semiconductor layer 56 included in the lower cladding layer 21 is exposed.

Figure 7:
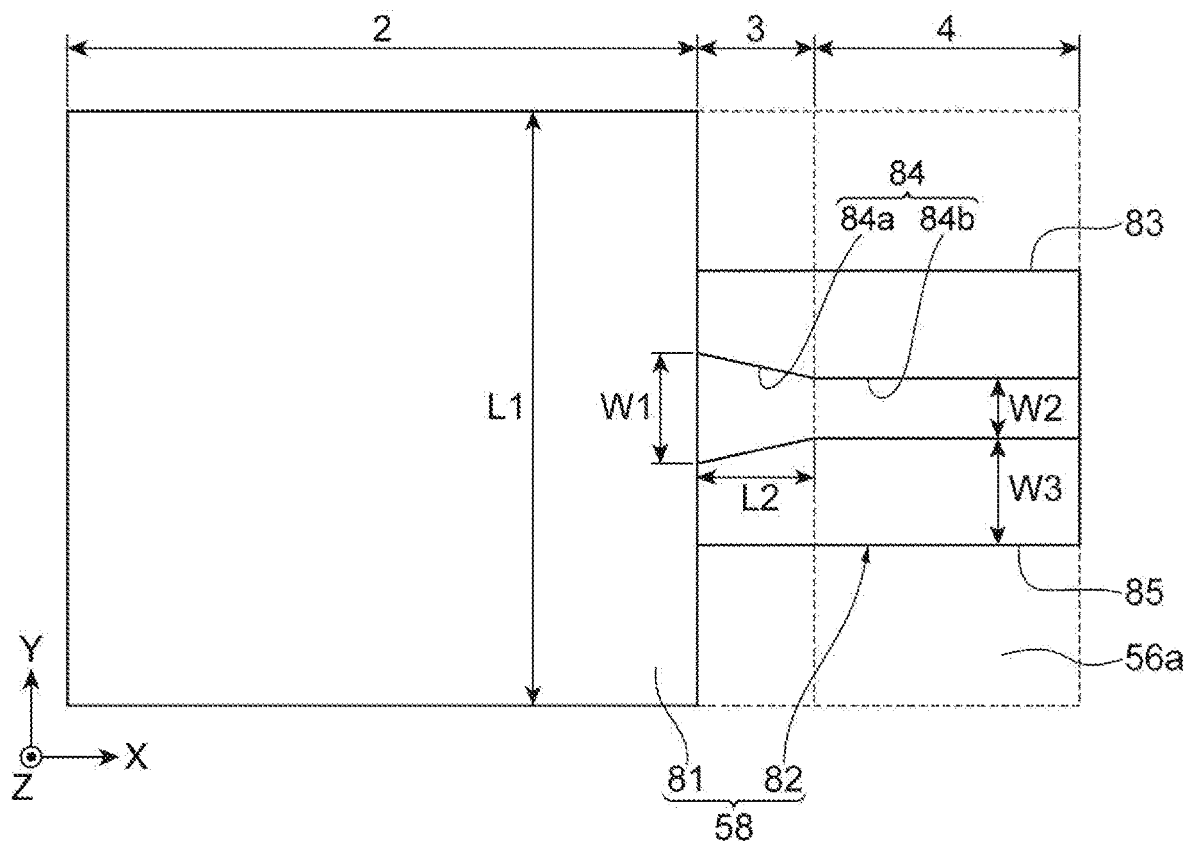
FIG. 7 is a schematic plan view showing the shape of a mask pattern.

Here, referring to FIG. 7, the shape of the mask pattern 58 will be described in detail. FIG. 7 is a schematic plan view showing the shape of the mask pattern 58. As shown in FIG. 7, the mask pattern 58 has a mask part 81 provided on the active layer 22 located in the laser area 2 and a mask part 82 provided on the active layer 22 located in the connection area 3 and the optical modulation area 4. The mask part 81 entirely covers the active layer 22. A length L1 of the mask part 81 along the direction Y is 100 μm or more and 150 μm or less, for example.

The mask part 82 covers a part of the active layer 22 located in the connection area 3 and the optical modulation area 4, and has openings 83 to 85 in turn disposed along the direction Y. The openings 83 and 85 that are a pair of openings different from the opening 84 are provided for adjusting the growth rate of the optical waveguide layer 31 formed in the opening 84, and overlaps with the second semiconductor layer 56. The opening 83 is located on one end side in the direction Y, and the opening 85 is located on the other end side in the direction Y. On the other hand, the opening 84 is the portion where the optical waveguide layer 31 is formed, and overlaps with a part of the second semiconductor layer 56. The opening 84 is located between the openings 83 and 85 in the direction Y. In the opening 84, a region 84*a* located in the connection area 3 exhibits a trapezoid shape in a plan view. The width of the region 84*a* along the direction Y (the pattern width) is narrower as closer to the optical modulation area 4 in the direction X. A maximum width W1 of the region 84*a* along the direction Y is 50 μm or more and 70 μm or less, for example. A length L2 of the region 84*a* along the direction X is 40 μm or more and 80 μm or less, for example. On the other hand, in the opening 84, a region 84*b* located in the optical modulation area 4 exhibits a rectangular shape in a plan view. A width W2 of the region 84*b* along the direction Y is 15 μm or more and 25 μm or less, for example. The width W2 of the region 84*b* is the same as the width of the end portion of the region 84*a* on the optical modulation area 4 side. In the mask part 82, a maximum width W3 of the portions sandwiching the opening 84 in along the direction Y is 20 μm or more and 30 μm or less, for example. Note that FIG. 4B corresponds to a cross-sectional view taken along a straight line passing the opening 84 along the direction X in FIG. 7.

Figure 4C:
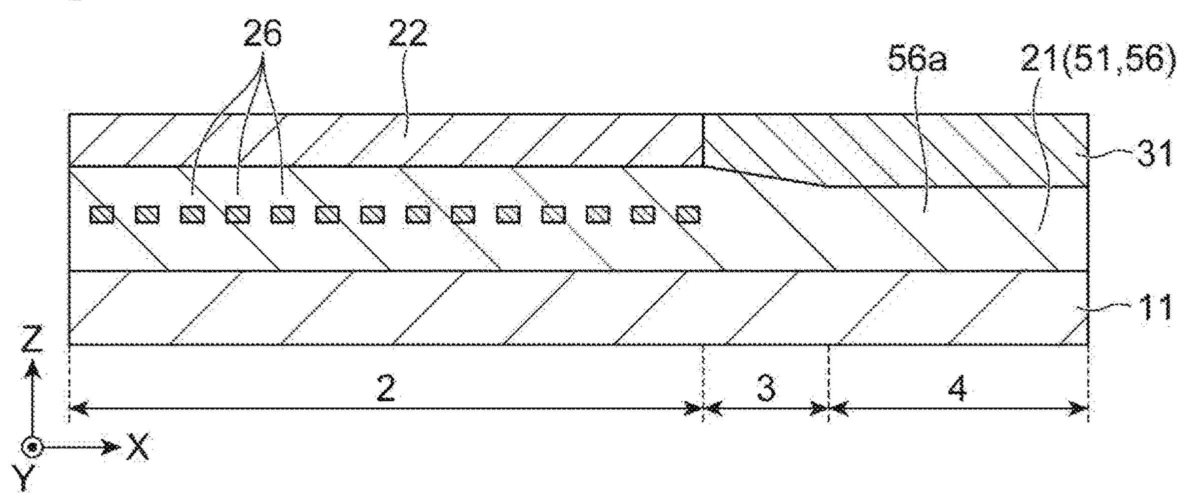

Subsequently, as shown in FIG. 4C, on the second portion 56*a* of the second semiconductor layer 56 exposed from the active layer 22, the optical waveguide layer 31 is formed (a ninth step). In the ninth step, the optical waveguide layer 31 is epitaxially grown in the opening 84 by metal organic chemical vapor deposition, for example, using the mask pattern 58. Subsequently, after the optical waveguide layer 31 is formed, the mask pattern 58 is removed. As described above, the width of the region 84*a* of the opening 84 formed on the mask pattern 58 along the direction Y is narrower as closer to the optical modulation area 4 in the direction X. Therefore, the growth rate of the optical waveguide layer 31 located in the connection area 3 is smaller as closer to the laser area 2. Thus, the top face F1 of the active layer 22 is aligned with the top face F2 of the optical waveguide layer 31 located in the connection area 3.

Figure 5A:
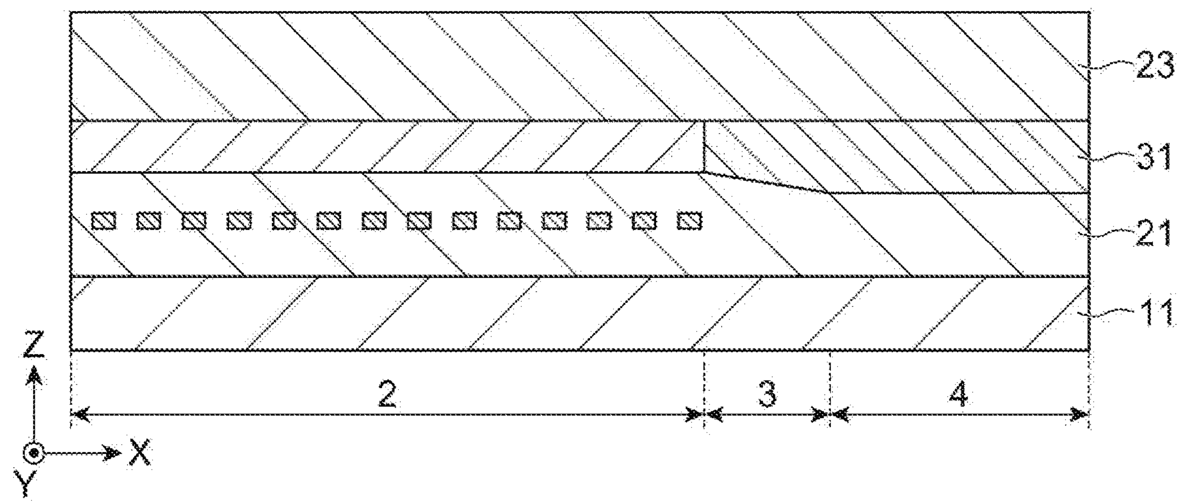
FIGS. 5A and 5B are diagrams illustrating a manufacturing method for the semiconductor laser device according to the embodiment.

Subsequently, as shown in FIG. 5A, on the active layer 22 and on the optical waveguide layer 31, the upper cladding layer 23 is formed (the tenth step). In the tenth step, the upper cladding layer 23 is epitaxially grown on the active layer 22 and on the optical waveguide layer 31 by metal organic chemical vapor deposition, for example.

Figure 5B:
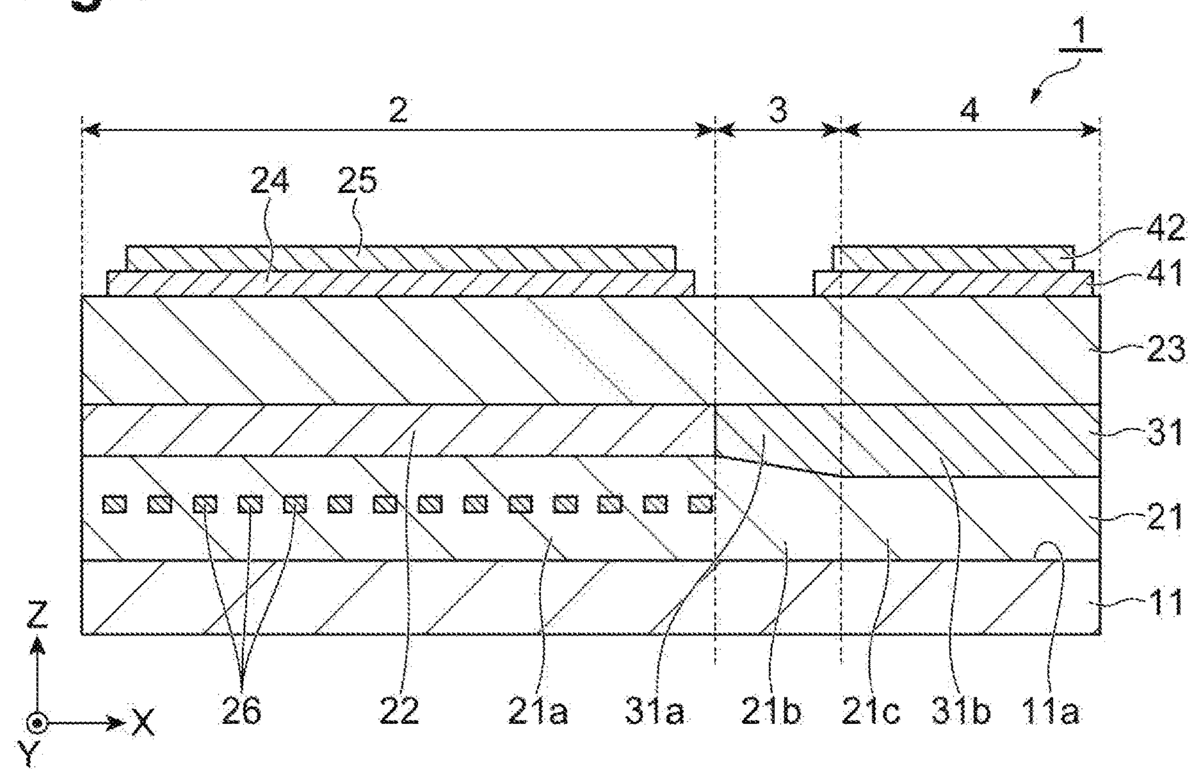

Subsequently, as shown in FIG. 5B, on the upper cladding layer 23, the contact layers 24 and 41 and the electrodes 25 and 42 are formed (an eleventh step). In the eleventh step, the pad 43 (see FIG. 1A) may be formed in forming the electrodes 25 and 42. Through the steps above, the semiconductor laser device 1 according to the embodiment is manufactured.

In the manufacturing method for the semiconductor laser device 1 according to the embodiment describe above, the unevenness 61 along the direction X is formed on the first portion 51*a* of the first semiconductor layer 51 using the mask pattern 54. In the unevenness 61 formed on the first portion 51*a*, the duty ratio of the unevenness 64 is greater on the laser area 2 side than on the optical modulation area 4 side. Moreover, the duty ratio of the unevenness 67 is constant, and equal to or less than the minimum value of that of the unevenness 64. Here, in the growth of the second semiconductor layer 56 on the first portion 51*a*, the capacity of the depression is greater in the region where the duty ratio of the unevenness is smaller, and hence the thickness of the second semiconductor layer 56 is thinner. Therefore, the thickness of the second semiconductor layer 56 located in the connection area 3 is thinner on the optical modulation area 4 side than on the laser area 2 side in the direction X. In addition to this, the thickness of the second semiconductor layer 56 located in the optical modulation area 4 is equal to or less than the thickness of the second semiconductor layer 56 located in the connection area 3. Thus, even in the case in which the optical waveguide layer 31 thicker than the active layer 22 is formed, forming a large step on the end face connecting part between the active layer 22 and the optical waveguide layer 31 can be suppressed. Therefore, according to the manufacturing method for the semiconductor laser device 1 of the embodiment, the semiconductor laser device 1 can be manufactured in which the thickness of the optical waveguide layer 31 in the optical modulation area 4 can be set greater than the thickness of the active layer 22 in the laser area 2, while the degradation of the coupling efficiency of the laser area 2 to the optical modulation area 4 is suppressed.

In addition to this, in the semiconductor laser device 1 according to the embodiment, the thickness of the second semiconductor layer 56 located in the connection area 3 is thinner on the optical modulation area 4 side than on the laser area 2 side in the direction X. Furthermore, the thickness of the second semiconductor layer 56 located in the optical modulation area 4 is equal to or less than the thickness of the second semiconductor layer 56 located in the connection area 3. Thus, the semiconductor laser device 1 can include the optical waveguide layer 31 thicker than the active layer 22 while forming a large step on the end face connecting part between the active layer 22 and the optical waveguide layer 31 is suppressed. Accordingly, the semiconductor laser device 1 can exert the operation and effect described above.

A large step on the end face connecting part between the active layer 22 and the optical waveguide layer 31 is formed because the difference between the thickness of the end face of the active layer 22 on the optical waveguide layer 31 side and the thickness of the end face of the optical waveguide layer 31 on the active layer 22 side is 40 nm or more, for example.

The manufacturing method for the semiconductor laser device 1 according to the embodiment includes the step of forming the diffraction grating layer 52 on the first semiconductor layer 51 and the step of removing the portion of the diffraction grating layer 52 located in the connection area 3 and the optical modulation area 4 to expose the first portion 51*a* of the first semiconductor layer 51. In the fourth step, the mask pattern 55 is formed on the diffraction grating layer 52, and in the fifth step, the diffraction gratings 26 are formed using the mask pattern 55. In this case, in forming the unevenness 61 on the first portion 51*a*, the diffraction gratings 26 can be formed in the laser area 2. Therefore, the semiconductor laser device 1 that can achieve stable single-mode oscillation can be manufactured.

In the embodiment, the duty ratio of the unevenness 64 located in the connection area 3 continuously changes along the direction X. Therefore, the thickness of the second semiconductor layer 56 located in the connection area 3 is continuously thinner from the laser area 2 side to the optical modulation area 4 side along the direction X. Therefore, the thickness of the optical waveguide layer 31 located in the connection area 3 can be continuously thick from the laser area 2 side to the optical modulation area 4 side along the direction X. Accordingly, no step is provided on the optical waveguide layer 31 located in the connection area 3, and hence the degradation of the coupling efficiency of the laser area 2 to the optical modulation area 4 can be preferably suppressed.

In the embodiment, in the ninth step, the optical waveguide layer 31 is formed in the opening 84 using the mask pattern 58 having the opening 84 overlapping with the second portion 56*a* of the second semiconductor layer 56, and the pattern width of the region 84*a* located in the connection area 3 in the opening 84 is narrower as closer to the optical modulation area 4 in the direction X. In this case, the growth rate of the optical waveguide layer 31 around the laser area 2 with a wide opening width becomes small. Therefore, forming a large step on the end face connection area between the active layer 22 and the optical waveguide layer 31 can be excellently suppressed, and hence the degradation of the coupling efficiency of the laser area 2 to the optical modulation area 4 can be preferably suppressed.

In the embodiment, the mask pattern 58 has the openings 83 and 85 separately from the opening 84. The openings 83 and 85 overlap with the second portion 56*a* of the second semiconductor layer 56. The opening 84 is located between the openings 83 and 85 in the direction intersecting with the direction X in a plan view. In this case, on the second portion 56*a*, a semiconductor layer constituting the optical waveguide layer 31 is grown not only in the opening 84 but also in the openings 83 and 85. Therefore, the growth rate of the optical waveguide layer 31 in the opening 84 becomes small. Therefore, the film quality of the optical waveguide layer 31 can be improved as well as the thickness of the optical waveguide layer 31 can be controlled. Accordingly, the active layer 22 can be connected to the optical waveguide layer 31 without the occurrence of a sudden change in the refractive index.

In the embodiment, the height of the top face F1 of the active layer 22 and the heights of the top faces F2 and F3 of the optical waveguide layer 31 are the same. In this case, no step is provided between the top faces of the active layer 22 and the optical waveguide layer 31, and hence the degradation of the coupling efficiency of the laser area 2 to the optical modulation area 4 can be preferably suppressed.

Figure 8:
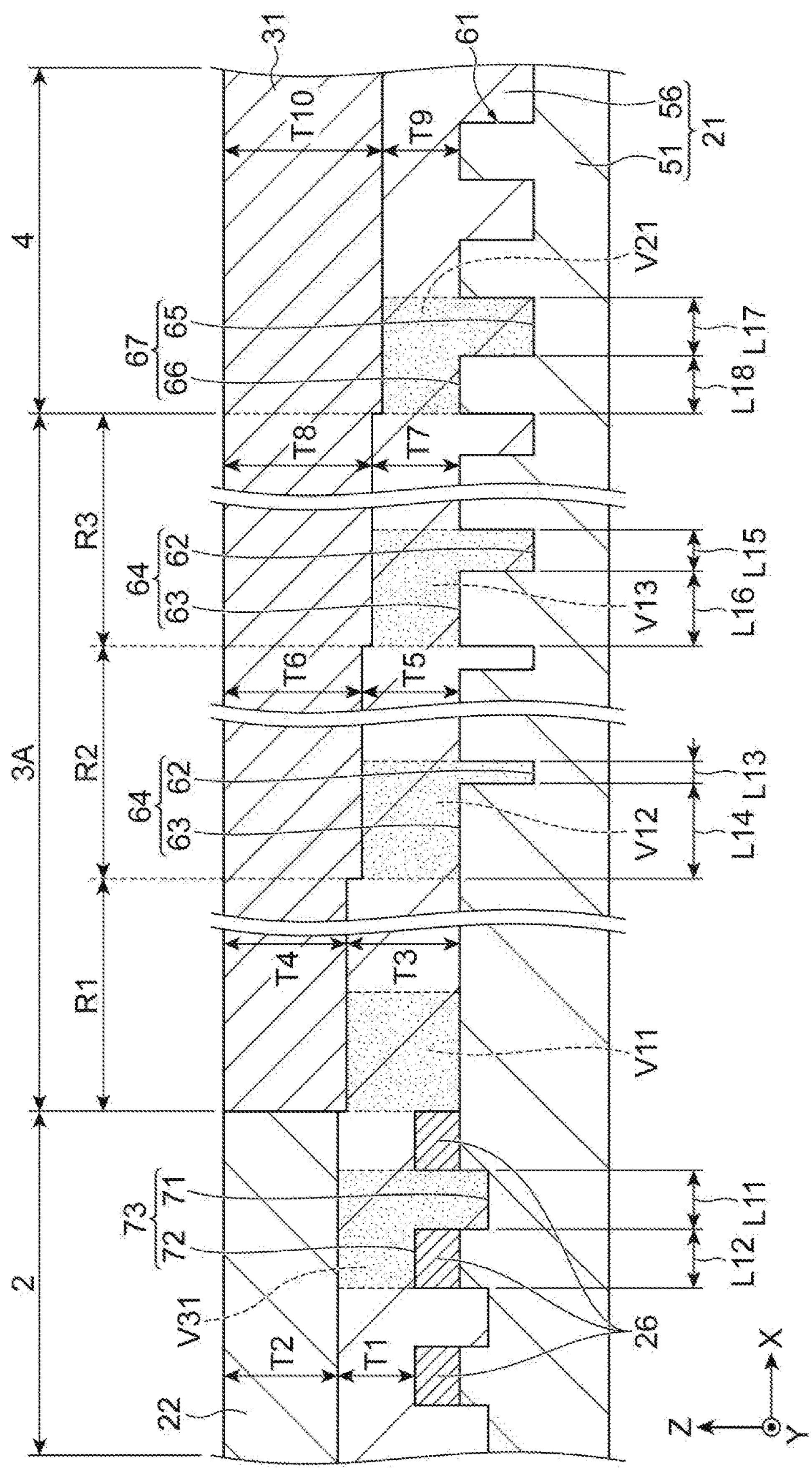
FIG. 8 is a schematic cross-sectional view illustrating unevenness according to a modification.

Next, referring to FIG. 8, a modification of the embodiment will be described. FIG. 8 is a schematic cross-sectional view illustrating unevenness according the modification. In FIG. 8, an unevenness 61, depressions 62, 65, and 71, projections 63, 66, and 72, and unevenness 64 and 73 are depicted by solid lines for explanation. As shown in FIG. 8, the thickness of the second semiconductor layer 56 located in a connection area 3A in the modification changes step by step along the direction X. Therefore, in the connection area 3A, the thickness of the optical waveguide layer 31 also changes step by step along the direction X. In the connection area 3A, transition regions R1 to R3 in turn arranged from the laser area 2 side along the direction X are defined. The lengths of the transition regions R1 to R3 along the direction X are 10 μm or more and 20 μm or less, for example.

The duty ratios of all the unevenness included in the transition region R1 is 1, and no depression is formed in the transition region R1. Therefore, the thickness of the second semiconductor layer 56 located in the transition region R1 is constant. The duty ratios of all the unevenness included in the transition region R2 is 0.8, for example. Therefore, the thickness of the second semiconductor layer 56 located in the transition region R2 is constant, and thinner than the thickness of the second semiconductor layer 56 located in the transition region R1. In addition to this, the duty ratios of all the unevenness included in the transition region R3 is 0.65, for example. Therefore, the thickness of the second semiconductor layer 56 located in the transition region R3 is constant, and thinner than the thickness of the second semiconductor layer 56 located in the transition region R2. Note that the thickness of the second semiconductor layer 56 located in the transition region R3 is thicker than the thickness of the second semiconductor layer 56 located in the optical modulation area 4.

In the modification, a thickness T1 of the second semiconductor layer 56 located on the diffraction gratings 26 is 130 nm, for example, and a thickness T2 of the active layer 22 located in the laser area 2 is 200 nm, for example. In the laser area 2, lengths L11 and L12 of the depression 71 and the projection 72, respectively, along the direction X are 50 nm, for example. A thickness T3 of the second semiconductor layer 56 located in the transition region R1 is 180 nm, for example, and a thickness T4 of the optical waveguide layer 31 located in the transition region R1 is 220 nm, for example. In the transition region R2, a thickness T5 of the second semiconductor layer 56 is 160 nm, for example, a thickness T6 of the optical waveguide layer 31 is 240 nm, for example, a length L13 of the depression 62 along the direction X is 40 nm, for example, and a length L14 of the projection 63 along the direction X is 160 nm, for example. In the transition region R3, a thickness T7 of the second semiconductor layer 56 is 140 nm, for example, a thickness T8 of the optical waveguide layer 31 is 260 nm, for example, a length L15 of the depression 62 along the direction X is 70 nm, for example, and a length L16 of the projection 63 along the direction X is 130 nm, for example. lengths L17 and L18 of the depression 65 and the projection 66, respectively, in the optical modulation area 4 along the direction X are 100 nm, for example. A thickness T9 of the second semiconductor layer 56 located on the projection 66 is 130 nm, for example, and a thickness T10 of the optical waveguide layer 31 located in the optical modulation area 4 is 280 nm, for example.

Also in the modification, the operation and effect similar to the embodiment are exerted. In addition to this, the unevenness 64 located in the connection area 3A can be easily formed, and hence the yields of the semiconductor laser device 1 can be improved.

Note that in the modification, in the connection area 3A, volumes V11 to V13 of the second semiconductor layer 56 provided on different unevenness 64 are the same. The volumes V11 to V13 are also the same as a volume V21 of the second semiconductor layer 56 provided on the unevenness 67 located in the optical modulation area 4. In addition to this, the volumes V11 to V13 are also the same as a volume V31 of the second semiconductor layer 56 located on the unevenness 73 located in the laser area 2.

The semiconductor laser device and the manufacturing method thereof according to the present disclosure are not limited to the foregoing embodiment and the modification, and can be variously modified. For example, any of the first to the eleventh steps may be omitted. For example, in the case in which no diffraction gratings are included in the semiconductor laser device, the second and the third steps may be omitted. In addition to this, a part of the fourth step may also be omitted In the embodiment, the boundary of the unevenness formed on the first portion of the first semiconductor layer is disappeared, but not limited to this. For example, the boundary of the unevenness can be detected using a cross-sectional SEM image, for example. In the lower cladding layer, the boundary between the first semiconductor layer and the second semiconductor layer can be detected. In this case, the duty ratio of the unevenness is the same as the duty ratio before the unevenness covered with the second semiconductor layer. For example, the duty ratio of the unevenness located in the connection area is greater on the laser area than side on the optical modulation area side, and the duty ratio of the unevenness located in the optical modulation area is constant, and equal to or less than the minimum value of the duty ratio of the unevenness located in the connection area.

In the modification, the opening of the mask pattern formed on the second semiconductor layer may exhibit no trapezoid shape in a plan view. For example, the width of the opening along the direction Y may change step by step along the direction X. In this case, the width of the opening along the direction Y is narrower as closer to the optical modulation area along the direction X. In the modification, an opening for forming the optical waveguide layer may be provided alone.

What is claimed is:

1. A manufacturing method for an optical semiconductor device including an electro absorption type modulator, a DFB laser, and a connection area connected between the electro absorption type modulator and the DFB laser in an integrated structure in a first direction on a semiconductor substrate, the manufacturing method comprising:

forming a first semiconductor layer on a semiconductor substrate;

forming a first mask pattern on the first semiconductor layer in the connection area and a first area where the electro absorption type modulator is formed;

forming an unevenness along the first direction on the first semiconductor layer in the connection area by using the first mask pattern;

forming a second semiconductor layer on the unevenness provided on the first semiconductor layer; and forming an optical waveguide layer on the second semiconductor layer, wherein the first mask pattern includes a first pattern in the first area and a second pattern in a second area where the DFB laser is formed, the first pattern including a first opening pattern and a first cover pattern adjacent to each other, and the second pattern including a second opening pattern and a second cover pattern adjacent to each other, and wherein a ratio of the first opening pattern to the first cover pattern is different from a ratio of the second opening pattern to the second cover pattern.

2. The manufacturing method according to claim 1, wherein the first mask pattern includes a third pattern in the connection area, and wherein, in the third pattern, a ratio of a length of a cover pattern to a total length of an opening pattern and the cover pattern adjacent to each other is greater on the DFB laser side than on the electro absorption type modulator side.

3. The manufacturing method according to claim 1, wherein, in the forming of the unevenness, the unevenness is formed to have a duty ratio in which a length of a projection to a total length of a depression and the projection adjacent to each other is greater on the DFB laser side than on the electro absorption type modulator side.

4. The manufacturing method according to claim 1, further comprising:

forming a diffraction grating layer on the first semiconductor layer; and etching an area arranged at the electro absorption type modulator and the connection area in the diffraction grating layer, and exposing the first semiconductor layer, wherein the first mask pattern is formed on the diffraction grating layer.

5. The manufacturing method according to claim 3, wherein the duty ratio in the connection area continuously or gradually changes.

6. The manufacturing method according to claim 1, wherein, in the forming the optical waveguide layer, a second mask pattern including an opening area above the second semiconductor layer is used, wherein the optical waveguide layer is formed in the opening area of the second mask pattern, and wherein a width of the opening area of the second mask pattern is narrower as closer to the electro absorption type modulator in the first direction.

7. The manufacturing method according to claim 6, wherein the second mask pattern includes a pair of opening areas above the second semiconductor layer and wherein, in the second mask pattern, the opening area is located between the pair of opening areas in a second direction intersecting with the first direction, in a plan view.

8. An optical semiconductor device comprising:

a laser including:

an electro absorption type modulator;

a DFB laser; and a connection area connected between the electro absorption type modulator and the DFB laser in an integrated structure in a direction on a semiconductor substrate;

a first semiconductor layer having an unevenness extending in the direction on the semiconductor substrate;

a second semiconductor layer provided on the unevenness of the first semiconductor layer;

an active layer provided on the second semiconductor layer; and an optical waveguide provided on the second semiconductor layer, the optical waveguide being arranged with the electro absorption type modulator and the connection area, wherein a duty ratio of the unevenness in the connection area is greater on the DFB laser side than on the electro absorption type modulator side, and wherein the duty ratio of the unevenness corresponds to a ratio of a length of a projection to a total length of the projection and a depression adjacent to the projection.

9. The optical semiconductor device according to claim 8, wherein a duty ratio of the unevenness in the electro absorption type modulator is constant.

10. The optical semiconductor device according to claim 9, wherein the duty ratio of the unevenness in the electro absorption type modulator is equal to or less than a minimum value of the duty ratio of the unevenness in the connection area.

11. The optical semiconductor device according to claim 8, wherein the duty ratio of the unevenness in the connection area continuously or gradually changes.

12. The optical semiconductor device according to claim 8, wherein a height of a top of the active layer and a height of a top of the optical waveguide are equal.

13. A manufacturing method for an optical semiconductor device including a laser area, a connection part, and an optical modulation area in turn disposed along an optical waveguide direction, the manufacturing method comprising:

forming a first semiconductor layer on a semiconductor substrate;

forming a first mask pattern on the first semiconductor layer in the connection part;

forming an unevenness along the optical waveguide direction on the first semiconductor layer in the connection part by using the first mask pattern;

forming a second semiconductor layer on the first semiconductor layer on which the unevenness is formed; and forming an optical waveguide layer on the second semiconductor layer, wherein, in the forming of the first mask pattern, the first mask pattern is formed to have a ratio in which a length of a cover pattern along the optical waveguide direction to a total length of an opening pattern and the cover pattern located in the connection part and adjacent to each other along the optical waveguide direction, and wherein, in the forming the unevenness, the unevenness is formed in which a ratio of a length of a projection along the optical waveguide direction to a total length of a depression and the projection located in the connection part and adjacent to each other along the optical waveguide direction is greater on the laser area side than on the optical modulation area side.

14. The manufacturing method according to claim 13, further comprising:

forming a diffraction grating layer on the first semiconductor layer; and removing a portion of the diffraction grating layer located in the connection part and in the optical modulation area to expose the first semiconductor layer, wherein, in the forming of the first mask pattern, the first mask pattern is formed on the diffraction grating layer, and wherein, in the forming of the unevenness, diffraction gratings on the first semiconductor layer are formed using the first mask pattern.

15. The manufacturing method according to claim 13, wherein, in the connection part, the ratio of the length of the projection to the total length of the depression and the projection adjacent to each other continuously changes or changes step by step along the optical waveguide direction.

16. The manufacturing method according to claim 13, wherein, in the forming of the optical waveguide layer, a second mask pattern including an opening overlapping with a part of the second semiconductor layer is used, wherein the optical waveguide layer is formed in the opening of the second mask pattern, and wherein a pattern width of a region located in the connection part and in the opening is narrower as closer to the optical modulation area in the optical waveguide direction.

17. The manufacturing method according to claim 16, wherein the second mask pattern has a pair of openings different from the opening, wherein the pair of openings overlaps with the second semiconductor layer, and wherein the opening is located between the pair of openings in a direction intersecting with the optical waveguide direction in a plan view.

* * * * *